(12) United States Patent
Huang et al.

(10) Patent No.: US 11,882,422 B2
(45) Date of Patent: Jan. 23, 2024

(54) HEAT DISSIPATION DEVICE

(71) Applicant: AAC Technologies Pte. Ltd., Singapore (SG)

(72) Inventors: Xingzhi Huang, Shenzhen (CN); Lin Liu, Shenzhen (CN); Dijiang Tong, Shenzhen (CN); Zhe Zhang, Shenzhen (CN); Jun Wu, Shenzhen (CN); Zhichen Chen, Shenzhen (CN); Zhaoyu Yin, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 808 days.

(21) Appl. No.: 16/996,894

(22) Filed: Aug. 19, 2020

(65) Prior Publication Data

US 2021/0029462 A1 Jan. 28, 2021

Related U.S. Application Data

(63) Continuation of application No. PCT/CN2019/097764, filed on Jul. 25, 2019.

(30) Foreign Application Priority Data

Jul. 22, 2019 (CN) .......................... 201921159971.5

(51) Int. Cl.
*H04R 9/02* (2006.01)
*H05K 7/20* (2006.01)

(52) U.S. Cl.
CPC ......... *H04R 9/022* (2013.01); *H05K 7/20127* (2013.01); *H05K 7/20254* (2013.01); *H05K 7/20472* (2013.01)

(58) Field of Classification Search
CPC ..................................................... H04R 9/002
See application file for complete search history.

(56) References Cited

U.S. PATENT DOCUMENTS

| | | | | |
|---|---|---|---|---|
| 4,210,778 A | * | 7/1980 | Sakurai | F28D 15/0266 381/349 |
| 8,810,426 B1 | * | 8/2014 | Morris | G08B 17/00 340/541 |
| 9,955,244 B2 | * | 4/2018 | Rothkopf | G04G 21/02 |
| 2004/0145859 A1 | * | 7/2004 | Nakamichi | H04R 9/022 361/600 |
| 2012/0039491 A1 | * | 2/2012 | Katz | H04R 9/022 381/150 |
| 2019/0349688 A1 | * | 11/2019 | Chen | H01L 23/467 |

* cited by examiner

*Primary Examiner* — Suhan Ni
(74) *Attorney, Agent, or Firm* — W&G Law Group

(57) ABSTRACT

The present application discloses a heat dissipation device. The heat dissipation device includes a heating element, a sounding device and a heat conductor. The speaker unit includes a diaphragm separating the accommodation space into a front cavity and a back cavity. The housing body is provided with first sound outlet holes communicating to the front cavity. Heat generated by the heating element is transferred outside along with an air flow in the front cavity. The heat dissipation device provided by the present application has the advantages of being good in heat dissipation effect and exquisite and compact in structure and capable of meeting the demand of miniaturization of the heat dissipation device.

14 Claims, 5 Drawing Sheets

HEAT DISSIPATION DEVICE

FIELD OF THE PRESENT DISCLOSURE

The present invention relates to an electronic device, and more particularly to a mobile terminal with a heat dissipation device.

DESCRIPTION OF RELATED ART

Some components, for example, a CPU, a battery and so on in an existing electronic device such as a mobile phone, a tablet personal computer and a smart bracelet will generate heat when the electronic device is used or charged. The generated heat will make the electronic device heat, so that use is affected. As time passes, it is easy to lead to a short service life of the electronic device.

In order to solve the heating problem of the components of the electronic device, a metal housing is adopted or a fan is arranged to form cross-ventilation in equipment. However, existing ways of solving heating of the components of the electronic device have some defects. The way of the metal housing is poor in heat dissipation effect and it is needed to make away a relatively large space to mount the fan as the fan is arranged in the equipment to form cross-ventilation, so that the size of the equipment is enlarged and the demand on miniaturization cannot be met.

Therefore, it is necessary to provide a novel heat dissipation device in a mobile terminal to solve the problems mentioned above.

SUMMARY OF THE INVENTION

One of the objects of the present invention is to provides a heat dissipation device with improved heat dissipation efficiency.

Accordingly, the invention discloses a heat dissipation device, comprising: a heating element; a sounding device, comprising a housing body provided with an accommodation space and a speaker unit arranged in the accommodation space, wherein the diaphragm separates the accommodation space into a front cavity and a back cavity, and the housing body is provided with first sound outlet holes communicating to the front cavity; a heat conductor, comprising a heat adsorption end, a heat dissipation end and a connection part connected between the heat adsorption end and the heat dissipation end, wherein the heat dissipation end is connected to the heating element; the heat dissipation end is arranged outside the housing body and covers the first sound outlet holes; wherein the heat dissipation end includes a plurality of second sound outlet holes communicating to the first sound outlet holes; heat generated by the heating element is conducted to the first outlet hole through the heat conductor and is transferred outside the first sound outlet holes along with air flow in the front cavity.

Further, the heat dissipation device further comprises a housing; the sounding device is mounted in the housing, the housing is provided with third sound outlet holes formed opposite to the first sound outlet holes, the heat dissipation end is arranged between the housing and the sounding device, and the second sound outlet holes are matched with the third sound outlet holes.

Further, the sounding device is a receiver, and the heat dissipation end is arranged between the housing and the receiver.

Further, the housing comprises a bottom plate and a side plate bending and extending from the edge of the bottom plate; the sounding device is fixed to the bottom plate; the housing body comprises a front cover directly opposite to the diaphragm; the heat dissipation end is clamped between the bottom plate and the front cover; and the bottom plate is provided with the third second outlet hole.

Further, the front cover is provided with the first sound outlet holes, and the first sound outlet holes is directly opposite to the second sound outlet holes.

Further, the pore diameter of the third sound outlet holes is smaller than the pore diameter of the first sound outlet holes and the pore diameter of the second sound outlet holes.

Further, the connection part comprises a first bent part bending and extending toward a direction far away from the bottom plate from the edge of the heat dissipation end and a second bent part bending and extending toward the direct far away from the sounding device to the heating end from the side, far away from the heat dissipation end, of the first bent part.

Further, the heating element is fixed to the bottom plate, and the heating end is attached to the side, far away from the bottom plate, of the heating element.

Further, the sounding device is a speaker, and the heat dissipation end is arranged between the housing and the speaker.

Further, the housing body comprises an upper cover and a lower cover matched with the upper cover to form an accommodation space; the upper cover comprises a top wall arranged opposite to the diaphragm and a side wall bending and extending toward a direction close to the lower cover from the edge of the top wall; the housing body further comprises a support wall extending into the accommodation space and supporting the speaker unit; the lower cover comprises a bottom wall opposite to the top wall and a surrounding wall bending and extending toward the direction of the upper cover from the edge of the bottom wall; the surrounding wall is arranged on the outer side of the side wall, and the first sound outlet holes penetrates through the surrounding wall and the side wall successively.

Further, the upper cover further comprises a blocking wall extending toward the direction of the speaker unit from the side wall; the blocking wall, the top wall and the side wall encircle a sound channel; the diaphragm, the top wall directly opposite to the diaphragm and the support wall form the front cavity; the front cavity comprises the front cavity and the sound channel; the sound channel communicates the front cavity to the first sound outlet holes.

Further, the heat dissipation end is arranged between the surrounding wall and the housing; the heat dissipation device further comprises a first sealing member arranged between the heat dissipation end and the surrounding wall; and the first sealing member is provided with h the a sound channel communicating to the first sound outlet holes and the second sound outlet holes.

Further, the sounding device further comprises a second sealing member clamped between the side wall and the surrounding wall; the second sealing member is provided with a second sound channel communicating to the first sound outlet holes in a penetrating manner corresponding to the first sound outlet holes.

Further, the heat conductor is a metal sheet or a heat conducting tube filled with a cooling liquid internally.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1:
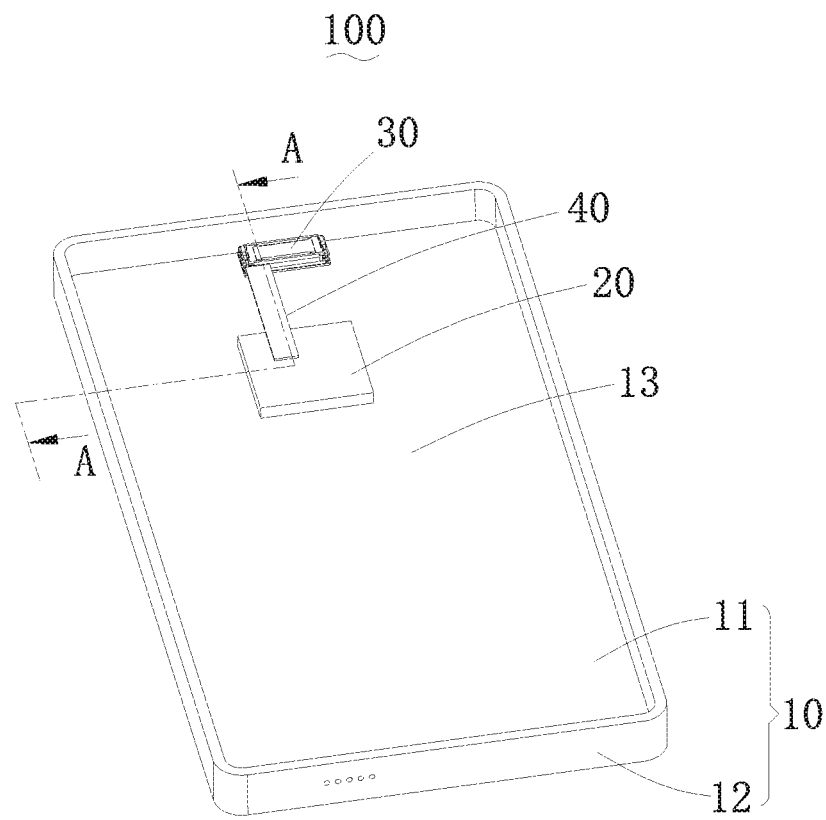
FIG. 1 is an illustration view of a heat dissipation device provided by an embodiment I of the present application.

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

It is to be noted that all directional indicators (such as upper, lower, left, right, front, back, inside, outside, top part and bottom part) in the embodiments of the present application are merely used for explaining relative position relationships among parts in a special gesture (for example, as shown in the drawings). If the special gesture changes, the directional indicators change correspondingly, too.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Embodiment I

Figure 2:
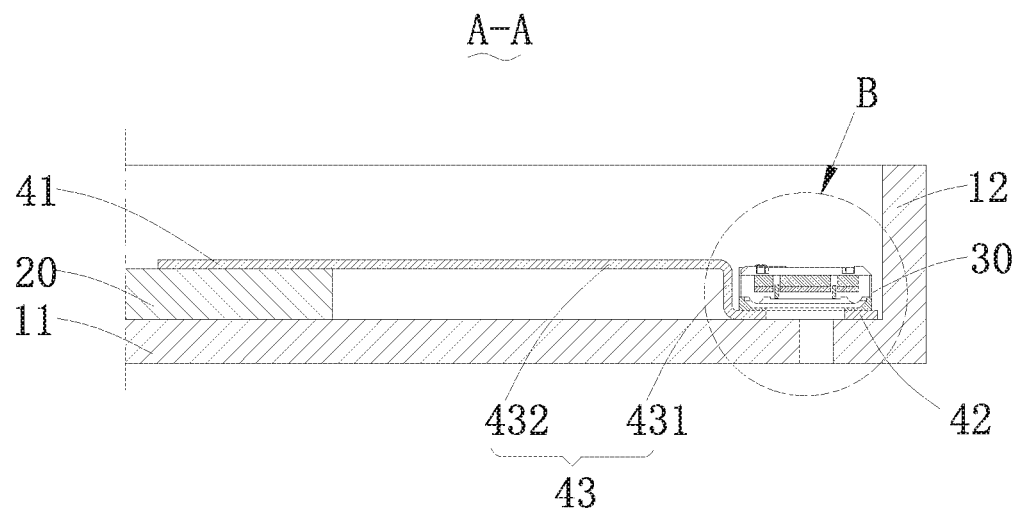
FIG. 2 is a cross-sectional view of the heat dissipation device taken along line A-A in FIG. 1.
Figure 3:
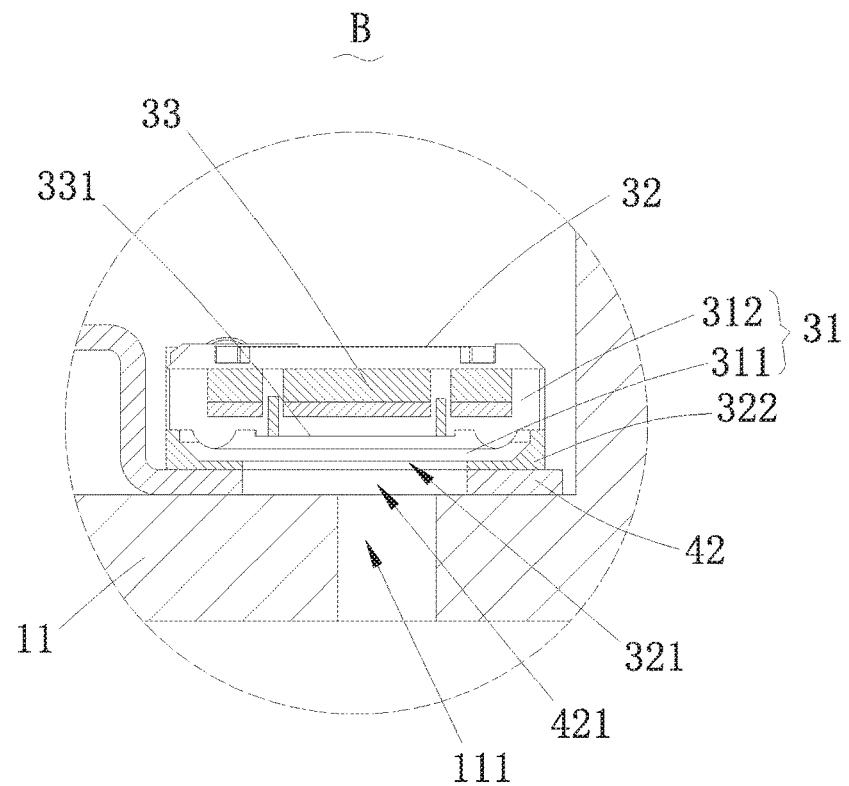
FIG. 3 is a partially enlarged view of part B in FIG. 2.
Figure 4:
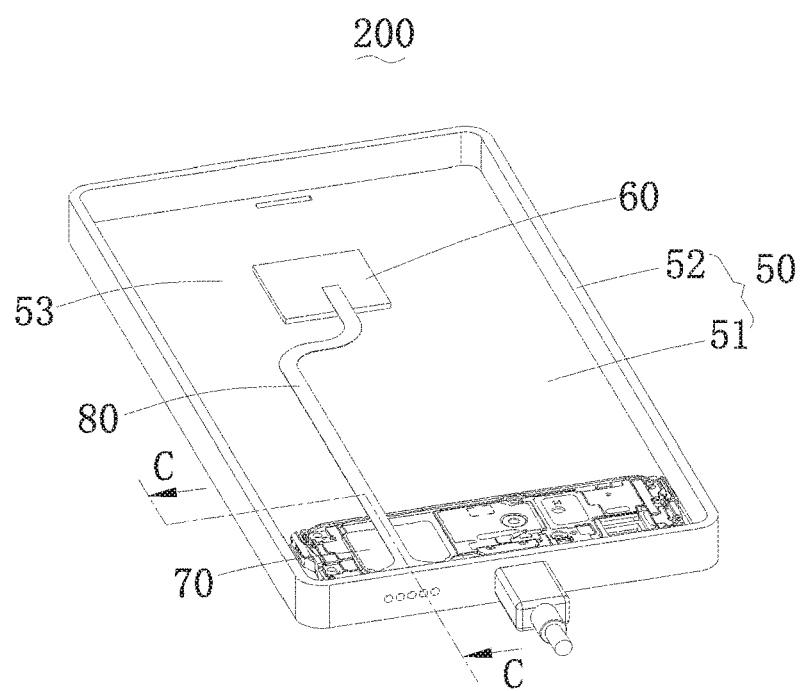
FIG. 4 is an illustration of the heat dissipation device provided by an embodiment II of the present application.
Figure 5:
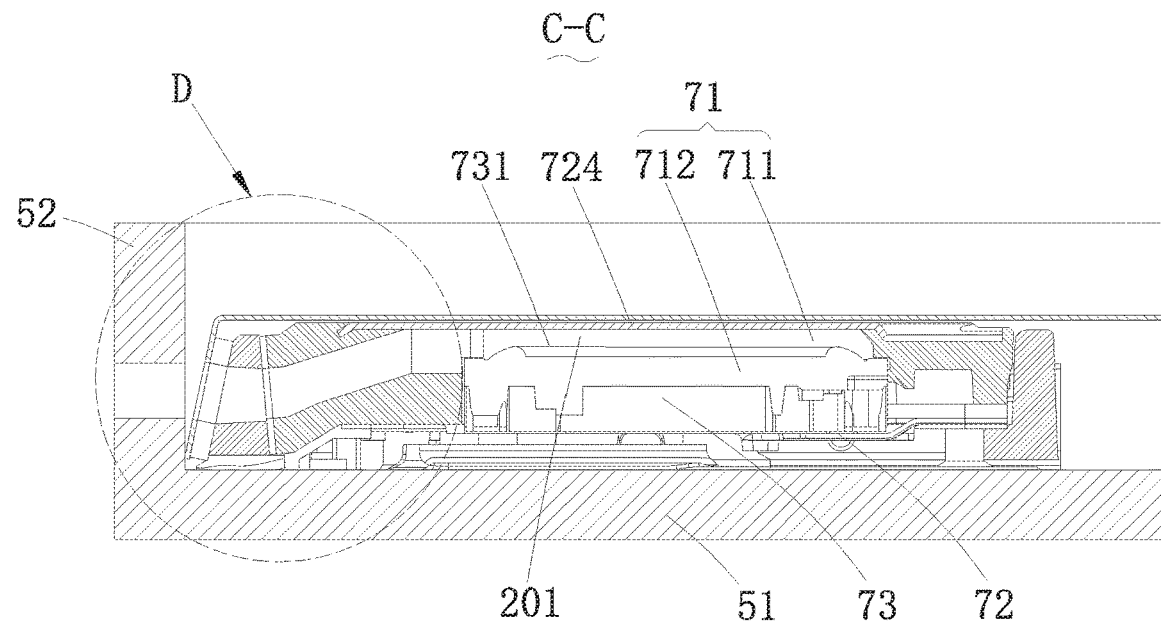
FIG. 5 is a cross-sectional view of the heat dissipation device taken along lien C-C in FIG. 4.
Figure 6:
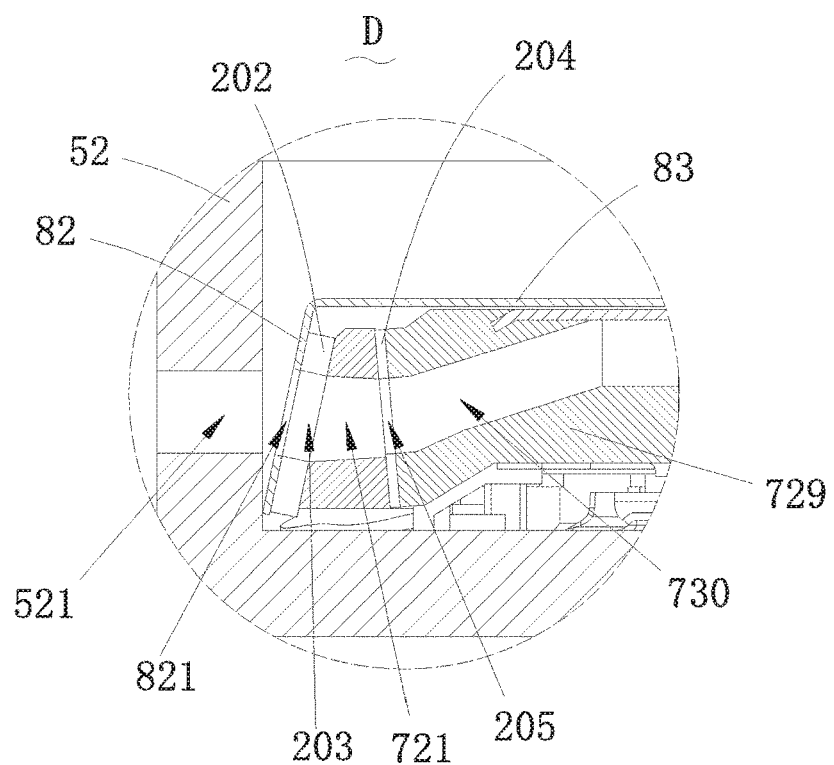
FIG. 6 is a partially enlarged view of part D in FIG. 5.
Figure 7:
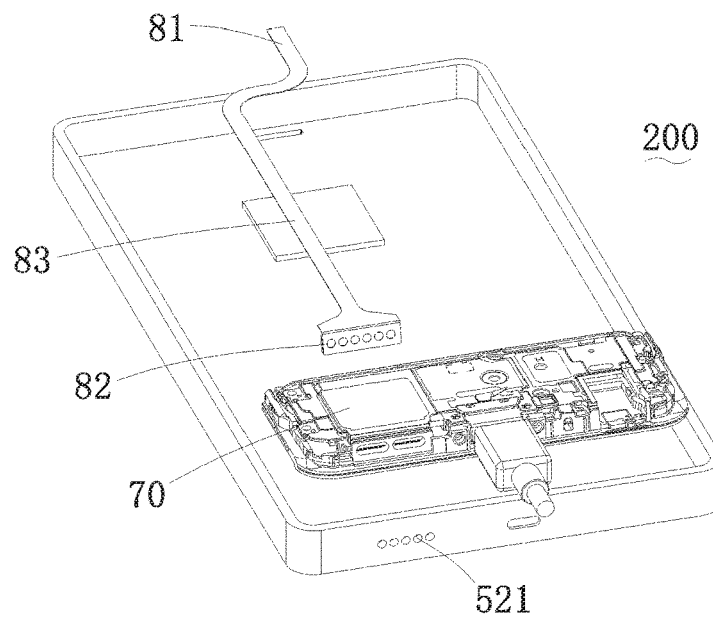
FIG. 7 is an exploded view of the heat dissipation device provided by the embodiment II of the present application.
Figure 8:
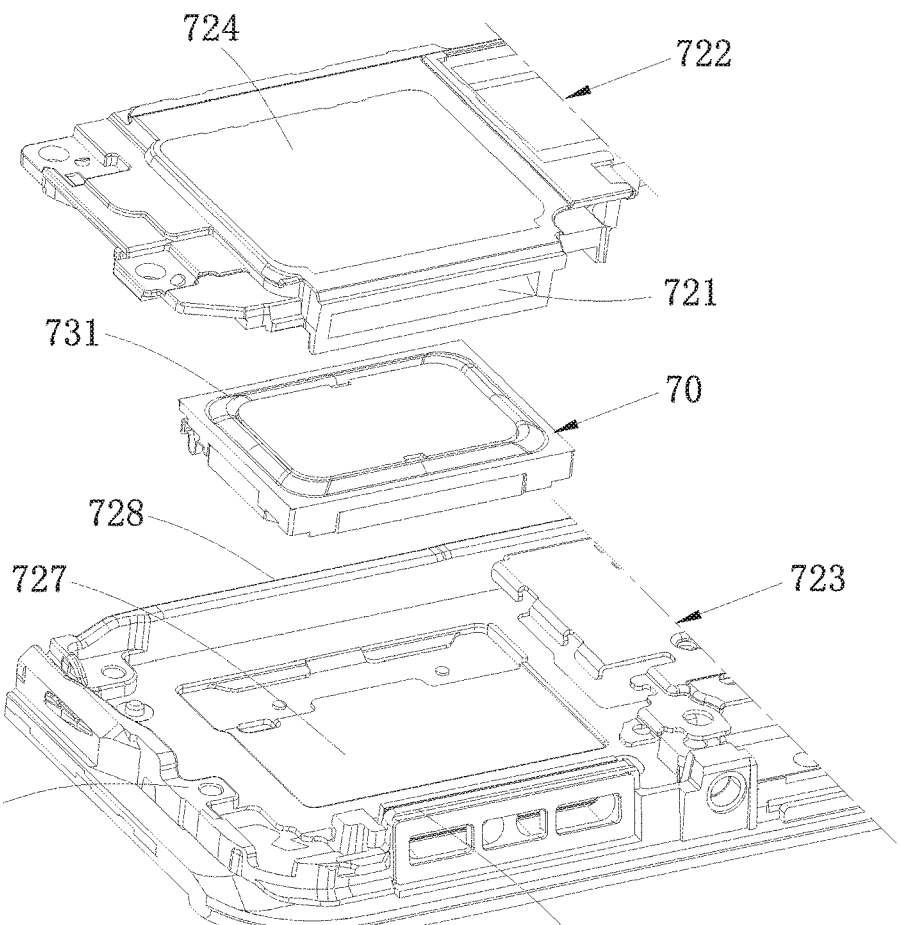
FIG. 8 is an assembled view of a upper cover, a lower cover and a speaker unit.
Figure 9:
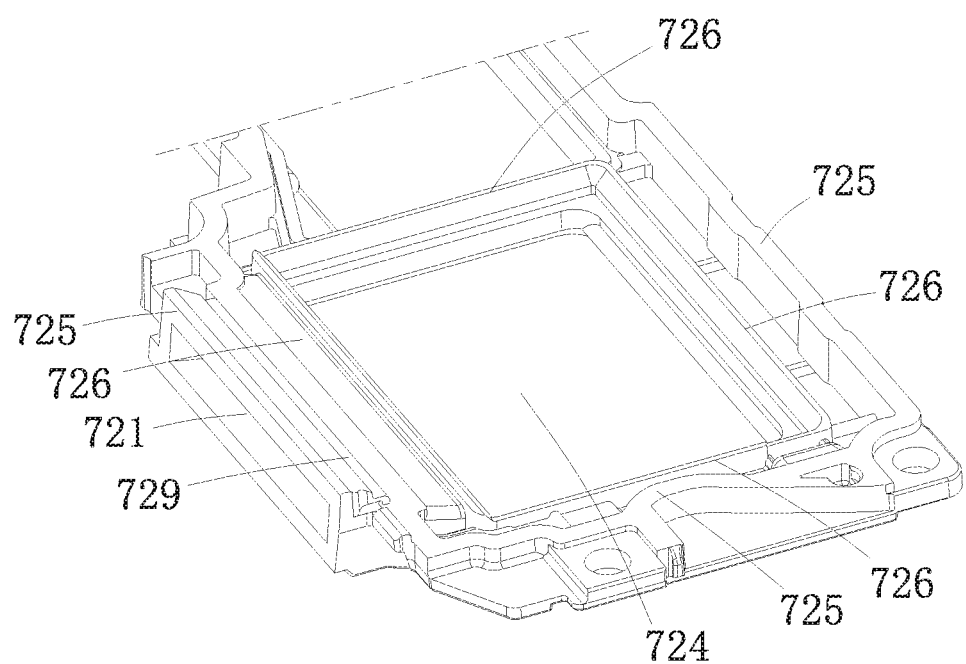
FIG. 9 is an isometric view of the upper cover.

With reference to FIG. 1 to FIG. 3, the embodiment I of the present application discloses a heat dissipation device 100, comprising a housing 10, a heating element 20, a sounding device 30 and a heat conductor 40. The housing 10 comprises a bottom plate 11 and a side plate 12 bending and extending from the edge of the bottom plate 11, the bottom plate 11 and the side plate 12 encircle an accommodation cavity 13, and the heating element 20, the sounding device 30 and the heat conductor 40 are mounted in the accommodation cavity 13.

The sounding device 30 comprises a housing body 32 provided with an accommodation space 31 and a speaker unit 33 arranged in the accommodation space 31. The speaker unit 33 comprises a diaphragm 331. The diaphragm 331 separates the accommodation space 31 into a front cavity 311 and a back cavity 312. The housing body 32 is provided with first sound outlet holes 321 communicating to the front cavity 311.

The heat conductor 40 comprises a heat adsorption end 41, a heat dissipation end 42 and a connection part 43 connected between the heat adsorption end 41 and the heat dissipation end 42, the heat adsorption end 41 is connected to the heating element 20, the heat dissipation end 42 is arranged outside the housing body 32 and covers the first sound outlet holes 321, and the heat dissipation end 42 is provided with second sound outlet holes 421 communicating to the first sound outlet holes 321.

When the heat dissipation device 100 operates, the heating element 20 generates heat. Heat generated by the heating element 20 is adsorbed by the heat adsorption end 41 of the heat conductor 40. Heat adsorbed by the heat adsorption end 41 is transferred to the heat dissipation end 42 through the connection part 43. The diaphragm 331 vibrates to generate an air flow, the air flow flows out from the first sound outlet holes 321, and heat on the heat dissipation end 42 is carried and transferred by the air flow flowing out from the first sound outlet holes 321 out of the first sound outlet holes 321. The process is repeated continuously, so that heat generated by operation of the heating element 20 can be transferred outside the heat dissipation device 100, thereby playing a heat dissipation role to the heating element 20.

In the embodiment, by arranging the heat conductor 40 to transfer heat generated by the heating element 20 to the sounding device 30, the sounding device 30 diffuses heat on the heat conductor 40 outside the first sound outlet holes 321 by means of the air flow generated by vibration of the diaphragm 331, thereby playing a heat dissipation role to the heating element 20. The arrangement mode not only is good in heat dissipation effect, but also generates an air cooling effect by using the sounding device 30. The heat dissipation device is exquisite and compact in structure and can meet the demand of miniaturization of the heat dissipation device 100.

As an improvement of the embodiment, the housing 10 is provided with third sound outlet holes 111 formed directly opposite to the first sound outlet holes 321, the heat dissipation end 42 is arranged between the housing 10 and the sounding device 30, and the second sound outlet holes 421 are matched with the third sound outlet holes 111.

Match means that the quantity and shapes of the second sound outlet holes 421 are designed by following the third sound outlet holes 111. As the housing 10 is provided with the third sound outlet holes 111 formed directly opposite to the first sound outlet holes 321, the diaphragm 331 vibrates to generate the air flow which can be diffused from the third sound outlet holes 111, so that heat generated by the heating element 20 is diffused outside the housing 10. As the second sound outlet holes 421 are matched with the third sound outlet holes 111, the heat dissipation end 42 will not affect the sound emitted by the speaker unit 33 from the volume diffused from the third sound outlet holes 111.

In an alternative embodiment, the heat dissipation device 100 is the mobile phone, the sounding device 30 is the receiver (the receiver of the mobile phone), and the heat dissipation end 42 is arranged between the housing 10 and the receiver. The heating element 20 can be a component, such as a CPU or a battery, which will generate heat when the mobile phone operates. It is to be noted that in terms of design of the existing mobile phone, when the heat conductor 40 is used for conducting heat generated by the CPU to the receiver and diffusing the heat to the first sound outlet holes 321 from the receiver, it is obviously advantageous in heat dissipation as the CPU of the mobile phone is closer to the receiver. It is to be further noted that the receiver has two states: normal working (for example, call accessing) and abnormal working (no call accessing). In the normal working state, the diaphragm 331 vibrates to generate the air flow to take away heat of the heat dissipation end 42. In the abnormal working state, a pulse signal can be introduced into the receiver to drive the diaphragm 331 to vibrate to generate the air flow. Preferably, frequency of the introduced pulse signal is lower than 1000 Hz. The pulse signal is an ultra-low frequency pulse signal which is not perceived by human ears.

As an improvement of the embodiment, the sounding device 30 is fixed to the bottom plate 11. The housing body 32 comprises a front cover 322 directly opposite to the diaphragm 331. The heat dissipation end 42 is clamped between the bottom plate 11 and the front cover 322, and the bottom plate 11 is provided with the third sound outlet holes 111. Preferably, the front cover 322 is made from a metal material, preferably stainless steel or copper. As the heat dissipation end 42 is clamped between the bottom plate 11 and the front cover 322, the heat dissipation end 42 is in contact with the front cover 322. As the front cover 322 is made from the metal material, the front cover 322 can absorb heat on the heat dissipation end 42 to the front cavity 311 quickly and transfers the heat outside the first sound outlet holes 321 through the air flow generated by vibration of the diaphragm 331, so that the heat dissipation efficiency is high.

As an improvement of the embodiment, the front cover 322 is provided with the first sound outlet holes 321, and the first sound outlet holes 321 are directly opposite to the second sound outlet holes 421.

As an improvement of the embodiment, the pore diameter of the third sound outlet holes 111 is smaller than the pore diameter of the first sound outlet holes 321 and the pore diameter of the second sound outlet holes 421.

As an improvement of the embodiment, the connection part 43 comprises a first bent part 431 bending and extending toward the direction far away from the bottom plate 11 from the edge of a heat dissipation end 42 and a second bent part 432 bending and extending toward the direction far away from the sounding device 30 to the heating end 41 from the side, far away from the heat dissipation end 42, of the first bent part 431.

As an improvement of the embodiment, the heating element 20 is fixed to the bottom plate 11, and the heating end 41 is attached to the side, far away from the bottom plate 11, of the heating element 20.

As an improvement of the embodiment, the heat conductor 40 is the metal sheet or the heat conducting tube filled with the cooling liquid internally.

Embodiment II

With reference to FIG. 4 to FIG. 9, the embodiment II of the present application discloses a heat dissipation device 200, comprising a housing 50, a heating element 60, a sounding device 70 and a heat conductor 80. The housing 50 comprises a bottom plate 51 and a side plate 52 bending and extending from the edge of the bottom plate 51, the bottom plate 51 and the side plate 52 encircle an accommodation cavity 53, and the heating element 60, the sounding device 70 and the heat conductor 80 are mounted in the accommodation cavity 53.

The sounding device 70 comprises a housing body 72 provided with an accommodation space 71 and a speaker unit 73 arranged in an accommodation space 72. The speaker unit 73 comprises a diaphragm 731. The diaphragm 731 separates the accommodation space 71 into a front cavity 711 and a back cavity 712. The housing body 72 is provided with first sound outlet holes 721 communicating to the front cavity 711.

The heat conductor 80 comprises a heat adsorption end 81, a heat dissipation end 82 and a connection part 83 connected between the heat adsorption end 81 and the heat dissipation end 82, the heat adsorption end 81 is connected to the heating element 60, the heat dissipation end 82 is arranged outside the housing body 72 and covers the first sound outlet holes 721, and the heat dissipation end 82 is provided with second sound outlet holes 821 communicating to the first sound outlet holes 721.

When the heat dissipation device 200 operates, the heating element 60 generates heat. Heat generated by the heating element 60 is adsorbed by the heat adsorption end 81 of the heat conductor 80. Heat adsorbed by the heat adsorption end 81 is transferred to the heat dissipation end 82 through the connection part 83. The diaphragm 731 vibrates to generate an air flow, the air flow flows out from the first sound outlet holes 721, and heat on the heat dissipation end 82 is carried and transferred by the air flow flowing out from the first sound outlet holes 721 out of the first sound outlet holes 721. The process is repeated continuously, so that heat generated by operation of the heating element 60 can be transferred outside the heat dissipation device 200, thereby playing a heat dissipation role to the heating element 60.

Similarly, in the embodiment, by arranging the heat conductor 80 to transfer heat generated by the heating element 60 to the sounding device 70, the sounding device 70 diffuses heat on the heat conductor 80 outside the first sound outlet holes 721 by means of the air flow generated by vibration of the diaphragm 731, thereby playing a heat dissipation role to the heating element 60. The arrangement mode not only is good in heat dissipation effect, but also generates an air cooling effect by using the sounding device 70. The heat dissipation device is exquisite and compact in structure and can meet the demand of miniaturization of the heat dissipation device 200.

As an improvement of the embodiment, the housing 50 is provided with third sound outlet holes 521 formed directly opposite to the first sound outlet holes 721, the heat dissipation end 82 is arranged between the housing 50 and the sounding device 70, and the second sound outlet holes 821 are matched with the third sound outlet holes 521.

In an alternative embodiment, the heat dissipation device 200 is the mobile phone, the sounding device 60 is a speaker, and the heat dissipation end 82 is arranged between the housing 50 and the speaker. The heating element 60 can be a component, such as a CPU or a battery, which will generate heat when the mobile phone operates.

The speaker has two states: normal working (for example, call accessing) and abnormal working (no call accessing). With reference to arrangement mode in the embodiment I, in the normal working state, the diaphragm 731 vibrates to generate the air flow to take away heat of the heat dissipation end 82. In the abnormal working state, a pulse signal can be introduced into the speaker to drive the diaphragm 731 to vibrate to generate the air flow. Preferably, frequency of the introduced pulse signal is lower than 1000 Hz. The pulse signal is an ultra-low frequency pulse signal which is not perceived by human ears.

As an improvement of the embodiment, the housing body 72 comprises an upper cover 722 and a lower cover 723 matched with the upper cover 722 to form an accommodation space 71. The upper cover 722 comprises a top wall 724 arranged opposite to the diaphragm 731 and a side wall 725 bending and extending toward a direction close to the lower cover 723 from the edge of the top wall 724. The housing body 72 further comprises a support wall 726 extending into the accommodation space 71 from the top wall 724 and supporting a speaker unit 73. The lower cover 723 comprises a bottom wall 727 opposite to the top wall 724 and a surrounding wall 728 bending and extending toward the direction of the upper cover from the edge of the bottom wall 727. The surrounding wall 728 is arranged on the outer side of the side wall 725, and the first sound outlet holes 721 penetrate the surrounding wall 728 and the side wall 725 successively.

As an improvement of the embodiment, the upper cover 722 further comprises a blocking wall 729 extending toward the direction of the speaker unit 73 from the side wall 725. The blocking wall 729, the top wall 724 and the side wall 725 encircle a sound channel 730. The diaphragm 731, the top wall 724 directly opposite to the diaphragm 731 and the support wall 726 form a front cavity 201. A front cavity 711 comprises the front cavity 201 and the sound channel 730. The sound channel 730 communicates the front cavity 201 to the first sound outlet holes 721.

As an improvement of the embodiment, the heat dissipation end 82 is arranged between the surrounding wall 728 and the housing 50. The heat dissipation device 200 further comprises a first sealing member 202 arranged between the heat dissipation end 82 and the surrounding wall 728, and the first sealing member 202 is provided with the first sound channel 203 communicating to the first sound outlet holes 721 and the second sound outlet holes 821 in a penetrating manner. By arranging the first sealing member 202, sound generated by the speaker unit 73 will not be diffused to the periphery between the surrounding wall 728 and the heat dissipation end 82.

As an improvement of the embodiment, the sounding device 70 further comprises a second sealing member 204 clamped between the side wall 725 and the surrounding wall 728. The second sealing member 204 is provided with a second sound channel 205 communicating to the first sound outlet holes 721 corresponding to the first sound outlet holes 721 in a penetrating manner. By arranging the first sealing member 204, sound generated by the speaker unit 73 will not be diffused to the periphery between the side wall 725 and the surrounding wall 728.

As an improvement of the embodiment, the heat conductor 80 is the metal sheet or the heat conducting tube filled with the cooling liquid internally.

What has been described above is only the embodiment of the present application. It should be pointed out here that for ordinary technicians in this field, improvements can be made without departing from the inventive concept of the present application, but these all belong to the protection scope of the present application.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A heat dissipation device, comprising:
a heating element;
a sounding device, comprising a housing body provided with an accommodation space and a speaker unit arranged in the accommodation space, wherein the speaker unit comprises a diaphragm, which the diaphragm separates the accommodation space into a front cavity and a back cavity, and the housing body is provided with first sound outlet holes communicating to the front cavity;
a heat conductor, comprising a heat adsorption end, a heat dissipation end and a connection part connected between the heat adsorption end and the heat dissipation end, wherein the heat dissipation end is connected to the heating element; the heat dissipation end is arranged outside the housing body and covers the first sound outlet holes;
wherein
the heat dissipation end includes a plurality of second sound outlet holes communicating to the first sound outlet holes; heat generated by the heating element is conducted to the first outlet hole through the heat conductor and is transferred outside the first sound outlet holes along with air flow in the front cavity.

2. The heat dissipation device as described in claim 1, wherein the heat dissipation device further comprises a housing; the sounding device is mounted in the housing, the housing is provided with third sound outlet holes formed opposite to the first sound outlet holes, the heat dissipation end is arranged between the housing and the sounding device, and the second sound outlet holes are matched with the third sound outlet holes.

3. The heat dissipation device as described in claim 2, wherein the sounding device is a receiver, and the heat dissipation end is arranged between the housing and the receiver.

4. The heat dissipation device as described in claim 3, wherein the housing comprises a bottom plate and a side plate bending and extending from the edge of the bottom plate; the sounding device is fixed to the bottom plate; the housing body comprises a front cover directly opposite to the diaphragm; the heat dissipation end is clamped between the bottom plate and the front cover; and the bottom plate is provided with the third second outlet hole.

5. The heat dissipation device as described in claim 4, wherein the front cover is provided with the first sound outlet holes, and the first sound outlet holes is directly opposite to the second sound outlet holes.

6. The heat dissipation device as described in claim 5, wherein the pore diameter of the third sound outlet holes is smaller than the pore diameter of the first sound outlet holes and the pore diameter of the second sound outlet holes.

7. The heat dissipation device as described in claim 6, wherein the connection part comprises a first bent part bending and extending toward a direction far away from the bottom plate from the edge of the heat dissipation end and a second bent part bending and extending toward the direct far away from the sounding device to the heating end from the side, far away from the heat dissipation end, of the first bent part.

8. The heat dissipation device as described in claim 7, wherein the heating element is fixed to the bottom plate, and the heating end is attached to the side, far away from the bottom plate, of the heating element.

9. The heat dissipation device as described in claim 2, wherein the sounding device is a speaker, and the heat dissipation end is arranged between the housing and the speaker.

10. The heat dissipation device as described in claim 9, wherein the housing body comprises an upper cover and a lower cover matched with the upper cover to form an accommodation space; the upper cover comprises a top wall arranged opposite to the diaphragm and a side wall bending and extending toward a direction close to the lower cover from the edge of the top wall; the housing body further comprises a support wall extending into the accommodation space and supporting the speaker unit; the lower cover comprises a bottom wall opposite to the top wall and a surrounding wall bending and extending toward the direction of the upper cover from the edge of the bottom wall; the surrounding wall is arranged on the outer side of the side wall, and the first sound outlet holes penetrates through the surrounding wall and the side wall successively.

11. The heat dissipation device as described in claim 10, wherein the upper cover further comprises a blocking wall extending toward the direction of the speaker unit from the side wall; the blocking wall, the top wall and the side wall encircle a sound channel; the diaphragm, the top wall directly opposite to the diaphragm and the support wall form the front cavity; the front cavity comprises the front cavity and the sound channel; the sound channel communicates the front cavity to the first sound outlet holes.

12. The heat dissipation device as described in claim 11, wherein the heat dissipation end is arranged between the surrounding wall and the housing; the heat dissipation device further comprises a first sealing member arranged between the heat dissipation end and the surrounding wall; and the first sealing member is provided with a sound channel communicating to the first sound outlet holes and the second sound outlet holes.

13. The heat dissipation device as described in claim 11, wherein the sounding device further comprises a second sealing member clamped between the side wall and the surrounding wall; the second sealing member is provided with a second sound channel communicating to the first sound outlet holes in a penetrating manner corresponding to the first sound outlet holes.

14. The heat dissipation device as described in claim 1, wherein the heat conductor is a metal sheet or a heat conducting tube filled with a cooling liquid internally.

\* \* \* \* \*